United States Patent [19]

Cullen et al.

[11] 4,422,055
[45] Dec. 20, 1983

[54] STRAIN RELIEF TECHNIQUE FOR SURFACE ACOUSTIC WAVE DEVICES

[75] Inventors: Donald E. Cullen, Manchester; Gary K. Montress, Glastonbury; Meyer Gilden, West Hartford; Robert A. Wagner, Manchester, all of Conn.

[73] Assignee: United Technologies Corporation, Hartford, Conn.

[21] Appl. No.: 316,699

[22] Filed: Oct. 30, 1981

[51] Int. Cl.³ .................. H03H 9/10; H03H 9/64; H03H 9/42
[52] U.S. Cl. .................................. 333/151; 333/194
[58] Field of Search ................ 333/193–196, 333/150–155; 29/25, 35; 310/313 R, 313 A, 313 B, 313 C, 313 D; 73/609, 654, 658, DIG. 4

[56] References Cited
U.S. PATENT DOCUMENTS

| | | | |
|---|---|---|---|
| 3,523,200 | 8/1970 | Newell | 310/313 B |
| 3,810,257 | 5/1974 | Jones et al. | 310/313 B |
| 4,004,254 | 1/1977 | De Vries | 333/153 |
| 4,085,620 | 4/1978 | Tanaka | 73/727 |
| 4,100,811 | 7/1978 | Cullen et al. | 73/654 |
| 4,213,104 | 7/1980 | Cullen et al. | 333/150 |

*Primary Examiner*—Marvin L. Nussbaum
*Attorney, Agent, or Firm*—David L. Adour

[57] ABSTRACT

A strain isolation technique for a surface acoustic wave (SAW) device having a piezoelectric SAW substrate is disclosed. A cut in the surface of the piezoelectric SAW substrate forms an isolated surface region where active SAW signal propagation occurs. The cut prevents undesirable surface strains from affecting SAW signal propagation in the isolated region.

4 Claims, 2 Drawing Figures

STRAIN RELIEF TECHNIQUE FOR SURFACE ACOUSTIC WAVE DEVICES

The government has rights in this invention, pursuant to contract number N00163-80-C-0025 awarded by U.S. Navy.

BACKGROUND OF THE INVENTION

1. Field of the Invention

This invention relates to surface acoustic wave (SAW) devices and more particularly relates to SAW devices which are constructed to reduce or substantially eliminate the effects of certain undesirable strains which affect the operating characteristics thereof.

2. Description of the Prior Art

Devices incorporating SAW delay lines and resonators, are known and are useful as component parts of pressure sensors and high frequency oscillators, and the devices are useful in a number of other applications. Some of the outstanding features of SAW devices are their ability to provide real time delays of electromagnetic waves within relatively compact substrate materials, and their inherent rugged construction. These features permit the use of SAW devices in high vibration and G-force environments.

Typically, a SAW device may be constructed to provide a SAW delay line or resonator with fixed operating characteristics, which do not depend on a strain-inducing phenomenon, for use as part of a SAW oscillator or other such SAW system. Alternatively, SAW devices may be constructed for use in measuring parameters which induce strain in the substrate of the devices and correspondingly affect the surface wave properties thereof. For example, the propagation velocity of a surface acoustic wave and the length of the propagation path of a SAW delay line, are both functions of strain in the substrate at and near the surface, whereby the operating frequency, of an oscillator dependent on a SAW delay line located on the surface, varies with the strain at the surface. In general, any type of strain-inducing parameter, such as pressure, temperature, force, acceleration and other similar mechanical parameters can be measured by a SAW device fabricated with a suitably deformable substrate.

In SAW devices, since the surface acoustic waves exist near the surface of the SAW substrate with atomic particle motion confined to a depth of approximately one SAW wavelength (referred to herein as "at the surface"), the problem of surface contamination of the SAW substrate may be particularly acute. Therefore, there are many applications for SAW devices which require that the devices be vacuum encapsulated, such as in the manner shown in U.S. Pat. No. 4,213,104 to Cullen, et al. which relates to a vacuum encapsulation structure for a SAW device wherein the encapsulating structure is fabricated from the same kind of material as the SAW substrate and is attached to the substrate by a glass-frit seal.

The vacuum encapsulation of SAW devices presents stability problems, such as strain which is induced in the SAW substrate from thermal expansion and contraction of the encapsulating structure and which may induce undesirable strains in the SAW propagation region. Also, the seal between the SAW substrate and a vacuum encapsulating structure, electrical connections, and clamps and other such holders for retaining a SAW substrate in a vacuum encapsulation structure as part of a SAW device, may all act as sources of stress which induce undesirable strains in the SAW propagation region. These undesirable strains distort the SAW substrate resulting in undesirable changes in the SAW propagation path and velocity for the device.

Techniques have been developed for reducing or substantially eliminating undesirable strain effects due to expansion and contraction of the propagation region of a SAW device as a function of temperature. For example, U.S. Pat. No. 4,100,811 to Cullen, et al. relates to a SAW pressure transducer having two SAW oscillators whose outputs are subtractively combined to increase the pressure sensitivity of the SAW device while reducing the temperature sensitivity of the device. However, this particular SAW transducer structure is not designed to reduce or substantially eliminate the effects of undesirable strains which are due to bonds between a vacuum encapsulation structure, or such other similar structure, and the SAW substrate of the device.

U.S. Pat. No. 4,085,620 to Tanaka does relate to a strain relief technique for isolating a piezoelectric element from strains originating at a bond between a supporting member for the element and a metal substrate. The supporting member comprises a connecting section and a neck section of a relatively smaller diameter which is constructed to absorb stresses originating at the bond between the supporting member and the substrate. However, this strain relief technique is not satisfactory since it does not isolate the active region from stress in the substrate per se. Furthermore, the supporting member has a relatively complex structure which may increase the sensitivity of the piezoelectric element to vibrations.

SUMMARY OF THE INVENTION

Therefore, an object of the present invention is to provide a SAW substrate for a SAW device which is substantially isolated from sources of undesirable strains, especially strains at the surface (surface strains) which are due to stresses such as stresses resulting from a seal between a vacuum encapsulation structure and the SAW substrate or from a clamp or other such holder for the SAW substrate.

Another object of the present invention is to provide a SAW substrate for a SAW device which is substantially isolated from sources of undesirable surface strains, which is relatively easy to construct, and which is relatively uncomplicated in structure.

These and other objects of the present invention are attained by a SAW device having a piezoelectric SAW substrate with a cut in the surface of the substrate surrounding a SAW propagation region to isolate this region from undesirable surface strains. The SAW propagation region may have one or more acousto-electric couplers forming one or more SAW delay lines which are isolated from the remaining surface area of the substrate by the cut. Electrical connections to external circuitry are made across the cut by flexible connectors, such as wire bonds or ribbon leads, which are constructed so that they do not transmit stresses from the substrate surface outside the cut to the surface region isolated by the cut.

A cover assembly may be attached to the SAW substrate to form a vacuum encapsulating structure enclosing the surface region isolated by the cut in the SAW substrate. The cut is designed to prevent undesirable surface strains, especially strains due to such factors as a seal between the vacuum encapsulating structure and the SAW substrate, from affecting the operation of the electro-acoustic couplers in the isolated SAW propagation region.

BRIEF DESCRIPTION OF THE DRAWING

Other objects and advantages of the present invention will be apparent from the following detailed description in conjunction with the accompanying drawings, wherein.

DETAILED DESCRIPTION

Figure 1:
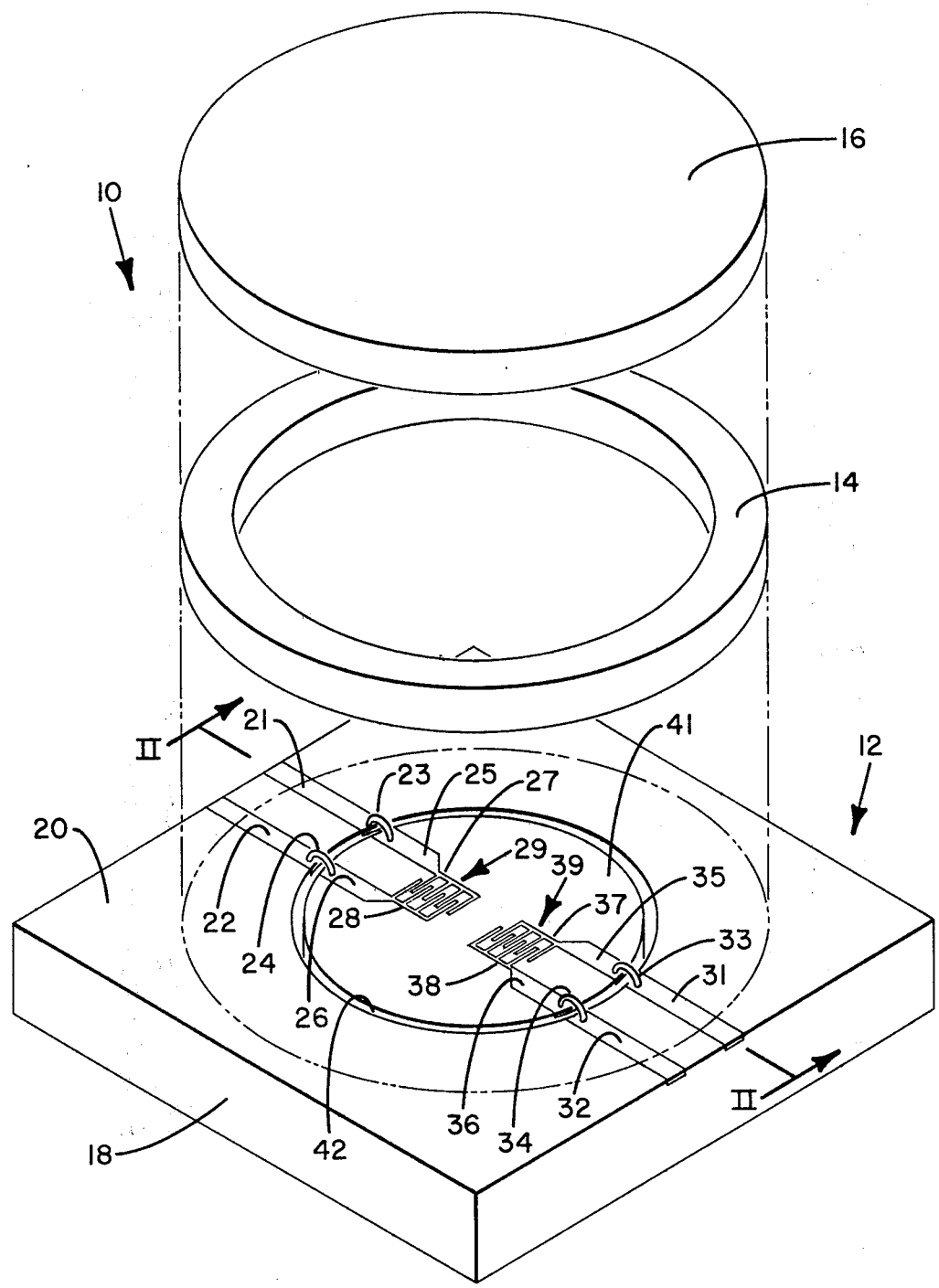
FIG. 1 is a perspective, exploded view of a vacuum encapsulated SAW device according to the present invention.
Figure 2:
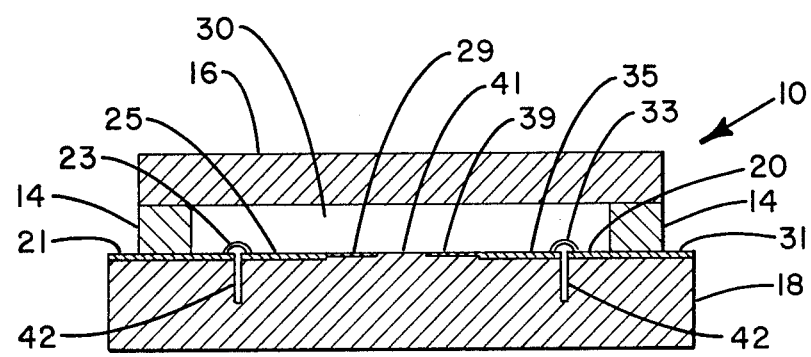
FIG. 2 is a sectional elevation view along the lines II—II, of the SAW device shown in FIG. 1.

Referring to FIG. 1, a vacuum encapsulated device 10 incorporating a SAW delay line is constructed according to the principles of the present invention. The SAW device 10 comprises a SAW base portion 12 and a vacuum encapsulation cover assembly including a top portion or cap 16 and a spacer 14. The base portion 12 includes acousto-electric couplers 29 and 39 (coupling means) disposed on a SAW active signal surface region 41 of a major surface 20 of a piezoelectric substrate 18. According to the present invention, the region 41 is isolated from the rest of the substrate surface 20 by a cut 42 in the surface 20. Referring to FIG. 2, it can be seen that the couplers 29 and 39 are enclosed in a chamber 30.

The spacer 14 and top portion 16 are made of the same material as the substrate 18 or are made of a material having the same thermal expansion properties as the substrate 18. Also, the spacer 14 and top portion 16 are bonded together, with the spacer 14 bonded to the major surface 20 of the piezoelectric SAW substrate 18, as described in U.S. Pat. No. 4,213,104 to Cullen, et al.

As shown in FIG. 1, the couplers 29 and 39 each comprise an interdigital transducer, which launches and receives surface acoustic waves, each including a pair of opposite phase electrodes 27, 28 and 37, 38, respectively. Each electrode 27, 28, 37, 38 includes a plurality of fingers interleaved with those of the opposite phase electrode. There are a number of different acousto-electric coupler configurations, including variations of the interdigital pattern itself, and although the illustrated couplers 29 and 39 represent a common configuration for a SAW delay line which may be used in high frequency SAW oscillators or SAW pressure sensing devices, the exact configuration of the SAW couplers 29 and 39 is not critical with respect to the present invention.

The substrate 18 is preferably a piezoelectric material such as quartz, lithium niobate, lithium tantalate, or any other such material which exhibits an acousto-electric coupling. Additionally, non-piezoelectric elastic substrates such as silicon, having a suitable thin film coating of piezoelectric material, such as zinc oxide, in the regions where acousto-electric coupling is required, may be used as the substrate 18. A surface acoustic wave can propagate in non-piezoelectric material, so only the surface below the electrodes 27, 28, 37, 38 need be piezoelectric, to provide the required acousto-electric coupling. Thus, the piezoelectric substrate may either be intrinsically piezoelectric or it may be formed of a non-piezoelectric material with suitable piezoelectric coating, either partly or totally covering the surface of interest.

In the example of a SAW device 10 which is shown in FIG. 1, each electrode 27, 28, 37, 38 is connected to a related inner conductor 25, 26, 35, 36 which extends from the corresponding electrode to the inside edge of the cut 42. A resilient wire 23, 24, 33, 34 connects each inner conductor 25, 26, 35, 36 to a corresponding outer conductor 21, 22, 31, 32 which extends from the outer edge of the cut 42 to provide a means for connecting the device 10 to electronic circuitry (not shown). As shown in FIG. 1, the outer conductors 21, 22, 31, 32 extend between the spacer 14 and the substrate surface 20 and reach beyond the outer edge of the spacer 14.

The conductors 21, 22, 25, 26, and 31, 32, 35, 36 may be deposited in recesses, as shown in the Figures, or on the surface 20, by any conventional process and may comprise thin-film aluminum, or aluminum lightly doped with copper. Also, the conductors 21, 22, 25, 26 and 31, 32, 35, 36 may include other layers of metals, such as titanium or chromium for improved adhesion. The wires 23, 24, 33, and 34 are flexible to prevent stresses from reaching the isolated surface region 41 from the remainder of the surface 20. Ribbon leads or other flexible electrical connection means may be used instead of the wires 23, 24, 33, 34, if desired.

The cut 42, as best shown in FIG. 2, should be generally perpendicular to the surface 20 of the substrate 18 and, for the device 10, is selected to be about one-half the thickness of the substrate 18. For the exemplary delay line device 10 shown in FIGS. 1 and 2 having a glass-frit seal for attaching the cover assembly to a 0.5 square inch surface 20 of a substrate 18 having a thickness of 100 mils, good results are achieved by a cut 42 having a depth between 25 and 75 mils (25% to 75% of the thickness of the substrate 18) which is centered about an axis through the center of the substrate 18 perpendicular to the surface 20. The cut may be as narrow as it can be made in practice, to save space. The key feature is that strains generated externally of the cut, such as those generated by stresses at the seal between the spacer 14 and the substrate 18, are prevented from inducing undesirable surface strains in the isolated surface region 41. The best depth, width and location for the cut 42 are dependent on the origin and magnitude of the undesirable surface strains, which are to be isolated from the region 41. Therefore, the exact location and configuration for a strain relief cut in a particular kind of SAW device may be determined best by testing prototypes of the particular SAW device which have different types of cuts.

Preferably, the cut 42 may be made by relative motion between the surface 20 and a diamond tipped hollow cylindrical cutter. Alternatively, the cut 42 may be made by ultrasonic milling using a cutter made from a thin-walled piece of stainless steel tubing of an appropriate diameter and wall thickness. The stainless steel tubing is vibrated against the surface 20 of the substrate 18 by an ultrasonic generator to bore into the substrate 18.

A highly accurate oscillator may be formed by connecting the SAW device 10 to electronic circuitry (not shown). As is known in the art, the frequency of operation for such a SAW oscillator is attained by constructing the SAW couplers 29 and 39 to have a particular periodicity. Oscillator frequencies in the range of 50 to 2000 megahertz are typical. A high frequency, stable SAW oscillator according to the present invention is suitable in many applications, such as frequency control, which require stability on the order of two parts in $10^9$ per week. The cut 42 in the surface 20 prevents undesirable surface strains from affecting the operation of the oscillator, thereby meeting the high stability requirements for such an oscillator. Similarly, the stability of other SAW devices is enhanced by means of the present invention.

The present invention has been described in conjunction with a device 10, incorporating a SAW delay line for use in a SAW oscillator. However, the principles of the present invention are applicable to many other SAW devices such as SAW pressure, temperature and force sensors, SAW resonators, SAW filters, and other such systems. Therefore, while the present invention has been described in conjunction with a particular embodiment it is to be understood that various modifications and other embodiments of the present invention may be made without departing from the scope of the invention as described herein and as claimed in the appended claims.

What is claimed is:

1. A surface acoustic wave (SAW) device, comprising:
    an elastic SAW substrate having a surface with at least one strain sensitive surface area;
    a cover bonded to the elastic SAW substrate to form a chamber above at least a portion of one of the strain sensitive surface areas of the elastic SAW substrate;
    a cut extending into the elastic SAW substrate and surrounding a selected surface region of the portion of the strain sensitive surface area which is within the chamber formed by the cover, said cut having a width and a depth sufficient to isolate the selected surface region from surface strains originating outside the selected surface region;
    at least one acousto-electric coupling means disposed on the isolated surface region; and
    connector means for electrically connecting each acousto-electric coupling means to electronic circuitry.

2. A surface acoustic wave (SAW) device comprising:
    an elastic SAW substrate having a strain sensitive surface with a cut in the surface of the substrate surrounding a region to isolate the region from surface strains originating outside the region;
    at least one acousto-electric coupling means disposed on the isolated surface region;
    at least one pair of inner electrical conductors connected to each acousto-electric coupling means and extending over said isolated surface region toward the inner edge of said cut;
    a matching pair of outer electrical conductors for each pair of inner electrical conductors, each matching pair of outer conductors having one end located on the substrate surface at the outside edge of said cut and having their other end extending out onto the substrate surface for connection to electronic circuitry; and
    flexible connector means for electrically connecting each matching pair of outer electrical conductors, across said cut, to the corresponding pair of inner electrical conductors on the isolated surface region.

3. A surface acoustic wave device comprising:
    a substrate having a surface of piezoelectric material;
    a cover bonded to the substrate to form a chamber above the piezoelectric material;
    a cut extending into the substrate surface enclosing a surface region of the piezoelectric material within said chamber, said cut having a width and depth sufficient to isolate said enclosed surface region from surface strains originating outside said enclosed surface region;
    at least one acousto-electric coupling means disposed on the piezoelectric surface in said enclosed surface region;
    electrical conductors extending from the outside to the inside of said chamber; and
    flexible electrical connectors extending across said cut for electrically connecting said electrical conductors to said acousto-electric couplers across said cut.

4. The surface electro-acoustic wave device as recited in claim 3 wherein said cut has a depth of between 25% to 75% of the thickness of the substrate.

* * * * *